(12) United States Patent
Jiang et al.

(10) Patent No.: US 8,687,401 B2
(45) Date of Patent: Apr. 1, 2014

(54) FERRO-RESISTIVE RANDOM ACCESS MEMORY (FERRO-RRAM), OPERATION METHOD AND MANUFACTURING METHOD THEREOF

(75) Inventors: Anquan Jiang, Shanghai (CN); Xiaobing Liu, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/266,752

(22) PCT Filed: Jan. 12, 2011

(86) PCT No.: PCT/CN2011/000050
§ 371 (c)(1),
(2), (4) Date: Mar. 23, 2012

(87) PCT Pub. No.: WO2011/091709
PCT Pub. Date: Aug. 4, 2011

(65) Prior Publication Data
US 2012/0281451 A1    Nov. 8, 2012

(30) Foreign Application Priority Data

Jan. 28, 2010 (CN) .......................... 2010 1 0102118
May 13, 2010 (CN) .......................... 2010 1 0175142

(51) Int. Cl.
*G11C 11/22* (2006.01)
(52) U.S. Cl.
CPC ...................................... *G11C 11/22* (2013.01)
USPC ........... 365/145; 365/100; 365/158; 365/174; 365/175
(58) Field of Classification Search
CPC .............. H01L 27/101; H01L 27/1021; H01L 27/2463; G11C 2213/56; G11C 13/0004; G11C 13/0069; G11C 2213/55; G11C 2213/73; G11C 2213/77

USPC .......................... 365/148, 100, 158, 174, 175
See application file for complete search history.

(56) References Cited

U.S. PATENT DOCUMENTS

2006/0131627 A1   6/2006 Kondo et al.
2007/0184613 A1*  8/2007 Kim et al. ..................... 365/211

OTHER PUBLICATIONS

Gotoh, et al., "Pt/PZT/n-SrTiO3 Ferroelectric Memory Diode", Jpn. J. Appl. Phys. vol. 35, Jan. 1996, pp. 39-43.
Jing-Lan et al., "Electrical Transport Properties of BiFeO3 Thin Film", J. Infrared Millim. Wave, vol. 25, No. 6, Dec. 2006, pp. 401-404.
Choi, et al., "Switchable Ferroelectric Diode and Photovoltaic Effect in BiFeO3", Science, vol. 324, Apr. 3, 2009, pp. 63-66.
Hua et al., "Au/PZT/BIT/p-Si Structure", Science in China, No. 3, vol. 31, Jun. 2009, pp. 223-227.

* cited by examiner

*Primary Examiner* — Thong Q Le
(74) *Attorney, Agent, or Firm* — McDonnell Boehnen Hulbert & Berghoff LLP

(57) ABSTRACT

The invention provides a Ferro-RRAM, a method of operating the Ferro-RRAM, and a method of fabricating the Ferro-RRAM, and pertains to the technical field of memory. The Ferro-RRAM comprises an upper electrode, a lower electrode, and a ferroelectric semiconducting thin-film layer provided between the upper electrode and the lower electrode and serving as a storage function layer; wherein the ferroelectric semiconducting thin-film layer is operable to generate a diode conduction characteristic by ferroelectric domain reorientation, and is operable to modulate the diode conduction characteristic by variation of the ferroelectric domain orientation; the Ferro-RRAM stores information according to variation of modulation of the diode conduction characteristic. The Ferro-RRAM has such characteristics of being simple in structure and fabrication, non-destructive readout and nonvolatile storage.

13 Claims, 4 Drawing Sheets

FERRO-RESISTIVE RANDOM ACCESS MEMORY (FERRO-RRAM), OPERATION METHOD AND MANUFACTURING METHOD THEREOF

FIELD OF THE INVENTION

The present invention pertains to the technical field of memories, and in particular relates to a ferro-resistive random access memory (Ferro-RRAM) based on ferroelectric semiconducting thin-film, a method for operating the same and a method for fabricating the same.

BACKGROUND

A nonvolatile memory is a kind of memory which is able to store information even in case of power off. Nonvolatile memories have been widely used in portable electronic devices etc, and are holding a larger and larger share in the whole market of memories. Currently, nonvolatile memories in the market still mainly take the form of Flash. However, due to the requirements on storing charge of Flash, it is impossible for the floating gate of Flash to be made thinner infinitely with the development of technologies. It is reported that the limit of flash technology is foreseen to be at about 24 nm, which forces people to search for new kinds of nonvolatile memory with superior performance.

Among these new nonvolatile memories which have already been proposed, there exist a Ferroelectric Random Access Memory (FeRAM), a Magnetic Random Access Memory (MRAM), a Phase Change Random Access Memory (PRAM) and a Resistive Random Access Memory (RRAM), etc, wherein the PRAM and RRAM both differentiate store statuses by detecting the magnitude of current when biasing read voltage. Therefore, they are collectively referred to as resistance-based memories in the industry.

Conventional FeRAMs stores information mainly by means of ferro-polarization in a ferroelectric capacitor. For example, a ferroelectric memory cell has a 1T1C and a 2T2C structure therein (wherein T refers to selection transistor and C refers to ferroelectric capacitor). In the ferroelectric capacitor, a ferroelectric material is served as insulating medium layer of the capacitor, and the FeRAM stores information based on charge variation of this capacitor. Therefore, the area of capacitor cell in conventional FeRAMs is overly large, a reference capacitor cell and a ferroelectric capacitor cannot be downsized at the same rate, making it difficult to form a high-density memory. Moreover, there exists a disadvantage of decrease of device reliability caused by severe destructive readout.

SUMMARY OF THE INVENTION

The object of the invention is to provide a new Ferro-RRAM without destructive readout.

According to an aspect of the invention, a Ferro-RRAM is provided, comprising an upper electrode, a lower electrode, and a ferroelectric semiconducting thin-film layer provided between the upper electrode and the lower electrode and serving as a storage function layer, wherein, the ferroelectric semiconducting thin-film layer is operable to generate a diode conduction characteristic depending on "forward" and "reversed" ferroelectric domain orientations, and is operable to modulate the diode conduction characteristic by variation of the ferroelectric domain orientations; the Ferro-RRAM stores information according to variation of modulation of the diode conduction characteristic.

Preferably, the upper electrode is a metal layer of Pt, Au, Ir, Ti or TaN, or a complex metal layer composed of the above metal layers, or a metal oxide electrode of $SrRuO_3$, $IrO_2$, $LaNiO_3$.

Preferably, the lower electrode is a metal layer of Pt, Au, Ir, Ti or TaN, or a complex metal layer composed of the above metal layers, or a metal oxide electrode of $SrRuO_3$, $IrO_2$, $LaNiO_3$.

According to an embodiment of Ferro-RRAM provided by the invention, the ferroelectric semiconducting thin-film layer can be $BiFeO_3$, $BaTiO_3$, $SrBi_2Ta_2O_9$, $(Ba,Sr)TiO_3$, $Pb(Zr,Ti)O_3$ or $Bi_{3.25}La_{0.75}Ti_3O_{12}$.

According to another embodiment of Ferro-RRAM provided by the invention, the ferroelectric semiconducting thin-film layer can be a complex structure thin-film layer mainly consisting of a ferroelectric oxide and semiconducting material nanocrystals.

Preferably, the ferroelectric oxide can be $BiFeO_3$, $BaTiO_3$, $SrBi_2Ta_2O_9$, $(Ba,Sr)TiO_3$, $Pb(Zr,Ti)O_3$ or $Bi_{3.25}La_{0.75}Ti_3O_{12}$ semiconductors, or a combination of the above mentioned ferroelectric oxides; the semiconductor nanocrystal can be a metal oxide semiconductor formed by a corresponding excess constituent in the ferroelectric oxides, or the semiconductor nanocrystal is Indium Tin Oxide (ITO) or zinc oxide.

Preferably, the range of thickness of the ferroelectric semiconducting thin-film layer is between 5 nm and 500 nm.

According to another aspect of the invention, a method of fabricating the Ferro-RRAM as described above is provided, comprising the following steps of:

(1) pattern-forming the lower electrode;
(2) pattern-forming the ferroelectric semiconducting thin-film layer on the lower electrode; and
(3) pattern-forming the upper electrode on the ferroelectric semiconducting thin-film layer.

Preferably, in step (2), the ferroelectric semiconducting thin-film layer is grown by pulsed laser deposition, sol-gel, molecular beam epitaxy, metal organic chemical vapor deposition, atomic layer deposition or magnetron sputtering techniques.

According to yet another aspect of the invention, a method of operating the Ferro-RRAM as described above is provided, comprising the following steps of:

in an operation of writing "0"/"1", biasing a negative pulse electrical signal between the upper electrode and the lower electrode so as to generate reversed ferroelectric domains in the ferroelectric semiconducting thin-film layer and to further generate a diode conduction characteristic which is conductive only in a negative direction;

in an operation of writing "1"/"0", biasing a positive pulse electrical signal between the upper electrode and the lower electrode so as to generate forward ferroelectric domains in the ferroelectric semiconducting thin-film layer and to further generate a diode conduction characteristic which is conductive only in a positive direction; and/or in a reading operation, biasing a reading voltage signal between the upper electrode and the lower electrode so as to read the magnitude of current flowing through the ferroelectric semiconducting thin-film layer and to thereby realize readout of the stored information.

Preferably, the electrical signal can be a voltage pulse signal.

Preferably, the magnitude of the voltage pulse signal is larger than a coercive voltage for the ferroelectric domain switching; the magnitude of reading voltage of the reading voltage signal is smaller than the coercive voltage for the ferroelectric domain switching.

According to the operating method provided by the invention, the writing voltage of the voltage pulse signal is in direct proportion to the thickness of the ferroelectric semiconducting thin-film layer.

The technical effects brought about by the invention lie in that the Ferro-RRAM provided by the invention works with the storing principles different from that of either conventional FeRAM or RRAM, and it has such characteristics of being simple in structure and fabrication, non-destructive readout and nonvolatile storage.

BRIEF DESCRIPTION OF THE DRAWINGS

The above and other objectives and advantages of the invention will become thoroughly clear from the following detailed description in connection with the accompanying drawings, wherein identical or similar elements are denoted by identical reference numerals.

DETAILED DESCRIPTION OF THE INVENTION

Figure 1:
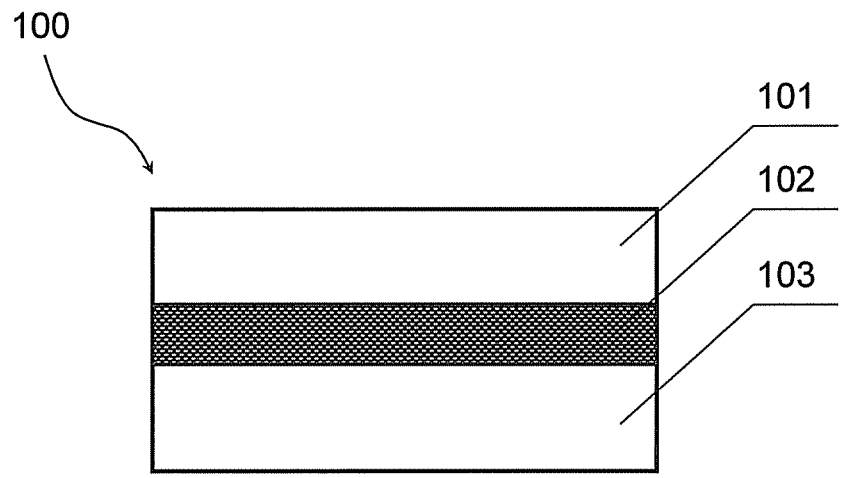
FIG. 1 is a schematic view showing an embodiment of basic structure of the Ferro-RRAM in accordance with the invention.

Hereinafter, some of many possible embodiments of the invention will be described in order to provide a basic understanding of the invention and not to identify crucial or decisive elements of the invention or define the scope of protection.

In the drawings, the thicknesses of layers and areas have been exaggerated for clarity. Moreover, such shape characteristics as rounding caused by etching are not illustrated in the drawings.

In the following embodiments, "positive direction/orientation" ("forward") and "negative direction/orientation" ("reversed") are defined with respect to the upper electrode. For example, when a positive voltage is biased on the upper electrode, the voltage is defined as "positive direction" voltage, and the orientations of polarization, ferroelectric domain and current, etc are also defined in this way.

FIG. 1 is a schematic view showing an embodiment basic structure of the Ferro-RRAM in accordance with the invention. The Ferro-RRAM 100 in accordance with an embodiment of by the invention will be described in detail hereinafter in connection with FIG. 1.

As shown in FIG. 1, Ferro-RRAM 100 includes a lower electrode 103, a ferroelectric semiconducting thin-film layer 102 and an upper electrode 101. Specifically, the lower electrode 103 can be selected as a metal layer of Pt, Au, Ir, Ti or TaN, or as a complex metal layer composed of the above metal layers, or as $IrO_2$, $LaNiO_3$, $SrRuO_3$; in this embodiment, the lower electrode 103 is a single-crystal $SrRuO_3$ or an epitaxial $SrRuO_3$ layer. In addition, the lower electrode can be formed by growing on a substrate. For example, in case where $SrRuO_3$ is used for the lower electrode, the growth substrate of the lower electrode 103 is preferably $SrTiO_3$ with crystal orientation (100). The lower electrode 103 can also be formed by growing on a Si substrate or a substrate of $Si/SiO_2$ complex layer.

Specifically, the upper electrode 101 can be selected as a metal layer of Pt, Au, Ir, Ti or TaN, or as a complex metal layer composed of the above metal layers, or as $IrO_2$, $LaNiO_3$, $SrRuO_3$; in this embodiment, the upper electrode 101 is a metal layer of Pt.

A ferroelectric semiconducting thin-film layer 102 is inserted between the upper electrode 101 and the lower electrode 103. The ferroelectric semiconducting thin-film layer 102 can be a single layer of perovskite-structured ferroelectric semiconducting materials, such as $BiFeO_3$, $BaTiO_3$, $SrBi_2Ta_2O_9$, $Pb(Zr,Ti)O_3$, $(Ba,Sr)TiO_3$, or $Bi_{3.25}La_{0.75}Ti_3O_{12}$, etc. It is noted that in the single layer of the above ferroelectric materials, certain functional trace elements are be doped. The categories of doped trace elements are not listed herein. In addition, the range of thickness of the ferroelectric semiconducting thin-film layer 102 can be between 5 nm and 500 nm. The specific factors for selection of the thickness will be revealed below.

Like other types of ferroelectric materials, first of all, the ferroelectric semiconducting thin-film layer 102 has a switchable ferroelectric polarization in two directions. In addition, the ferroelectric semiconducting thin-film layer 102 simultaneously has a semiconducting characteristic. Therefore, a voltage signal (e.g., a voltage pulse signal) is biased between the upper electrode and the lower electrode for polarizing the ferroelectric semiconducting thin-film layer 102, which further results that ionic displacement charges induced on the surface of the ferroelectric semiconducting thin-film layer 102 make carriers inside the body of the ferroelectric semiconducting thin-film layer 102 re-distributed. The gathering of carriers in areas inside the ferroelectric semiconducting thin-film layer 102 makes it possible to generate potential barrier difference inside the body so as to form a diode conduction characteristic of a p-n junction, i.e., the ferroelectric domain makes the ferroelectric semiconducting thin-film layer 102 generate the diode conduction characteristic. At this time, the ferroelectric semiconducting thin-film layer 102 is equivalent to a diode which is conductive in certain direction, i.e., it possesses a diode-like conduction.

Moreover, as the direction of voltage biased between the upper electrode and the lower electrode varies (i.e., as the voltage pulse signal changes in directions of positive and negative), the polarization direction the ferroelectric semiconducting thin-film layer 102 varies, i.e., the ferroelectric domain orientation varies, carriers inside the body of the ferroelectric semiconducting thin-film layer 102 re-distribute again, and distribution of potential barrier inside the body of the ferroelectric semiconducting thin-film layer 102 also varies, thus leading to a variation of current rectification direction, i.e., a variation of the conductive direction of the diode or a switching of p-n junction. At this time, the ferroelectric semiconducting thin-film layer 102 is equivalent to a diode which is conductive in another direction. The specific storage principle of the Ferro-RRAM 100 will be described in further details in the following embodiments hereinafter.

Figure 2:
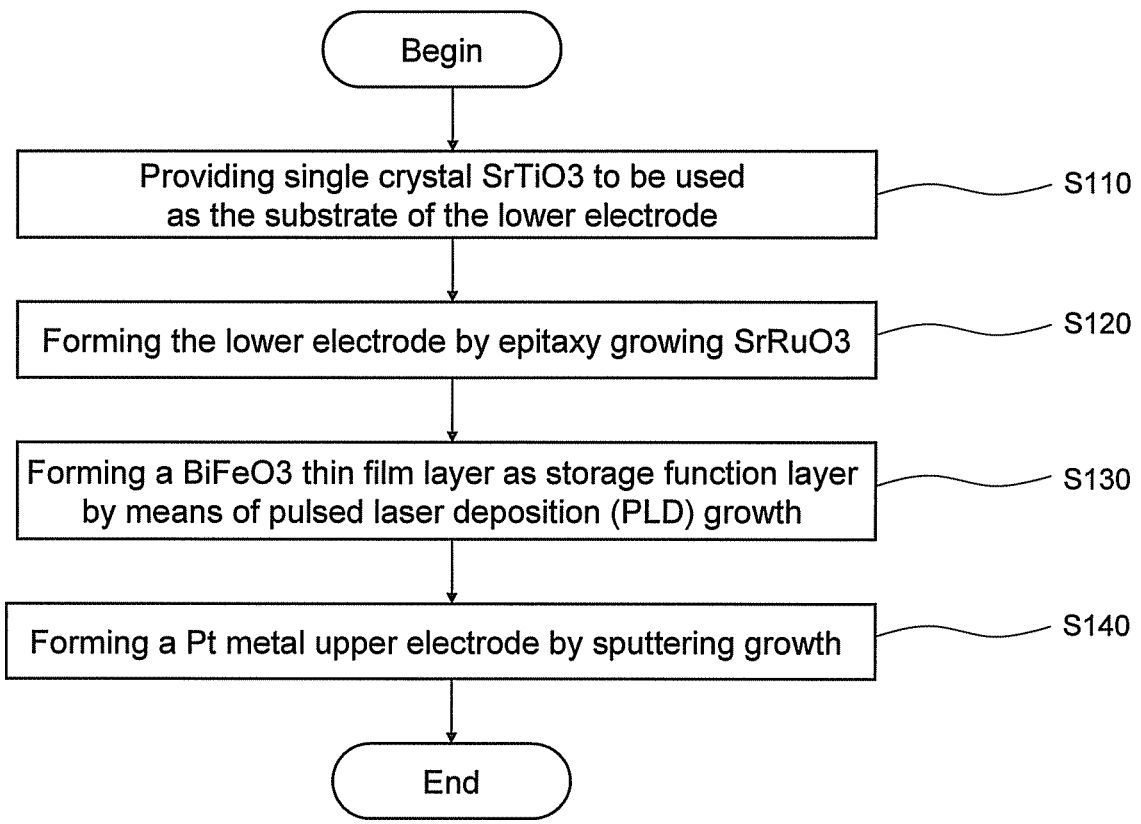
FIG. 2 is a schematic view showing an embodiment of flowchart of the method for fabricating the Ferro-RRAM shown in FIG. 1.

FIG. 2 is a schematic view showing an embodiment of flowchart of the method for fabricating the Ferro-RRAM shown in FIG. 1. The embodiment of preparation method will be described in detail in connection with FIGS. 1 and 2.

Firstly, at step S110, a single-crystal $SrTiO_3$ is provided to be used as the substrate of the lower electrode.

In this embodiment, the crystal orientation of SrTiO₃ is (100). A thin-film layer (e.g., SrRuO₃) can be additionally grown on the single-crystal SrTiO₃ so that the lower electrode 103 of the Ferro-RRAM can be formed. Therefore, the single-crystal SrTiO₃ is used as the substrate of the lower electrode. In other embodiments, other materials can also be selected as the substrate of the lower electrode. For example, Si, or a complex structure substrate (Si/SiO₂) formed by growing SiO₂ on Si can be selected.

Further, at step S120, the lower electrode can be formed by epitaxial growth of SrRuO₃.

In this embodiment, the lower electrode 103 is formed by epitaxial growth of SrRuO₃ thin-film layer on the single-crystal SrTiO₃, and the specific thickness of the SrRuO₃ thin-film layer can be within the range of 50-150 nm, however, that is not a limit. The growing method of SrRuO₃ thin-film layer is not limited to the epitaxial growth. In other embodiments, it could be a physical and chemical thin-film fabricating method, such as pulsed laser deposition, sol-gel, molecular beam epitaxy (MBE), metal organic chemical vapor deposition (MOCVD), atomic layer deposition (ALD) or magnetron sputtering, etc., which are suitable for the growth of oxides. The category of the lower-electrode material is not limited to SrRuO₃. In other embodiments, the material of the lower electrode growing on the single-crystal SrTiO₃ could also be LaNiO₃ or metal thin-film layer.

Further, at step S130, a BiFeO₃ thin-film layer is grown by means of pulsed laser deposition (PLD) and is used as a storage function layer.

In this embodiment, the BiFeO₃ thin-film layer is a semiconducting thin-film layer and the range of film thickness thereof could be in the range of 5-500 nm. Specifically, the conditions for PLD growth could be: an oxygen pressure of 10-30 Pa and a laser energy of 1-1.5 J/cm². The specific growing method for BiFeO₃ thin-film layer is also not limited. For example, in other embodiments, it could be a physical and chemical thin-film fabricating method such as pulsed laser deposition, sol-gel, molecular beam epitaxy (MBE), metal organic chemical vapor deposition (MOCVD), atomic layer deposition (ALD) or magnetron sputtering, etc., which are suitable for the growth of oxides. A semiconducting thin-film characteristic of the BiFeO₃ thin-film layer depends on the specific growing conditions. Herein, the BiFeO₃ thin-film layer is a ferroelectric semiconducting thin-film layer 102 which has a ferroelectric polarization characteristic and a semiconductor characteristic simultaneously, and is used as a storage function layer. However, the specific category of material of the ferroelectric semiconducting thin-film layer 102 is not limited to this embodiment. In other embodiments, the ferroelectric semiconducting thin-film layer 102 could also be ferroelectric semiconducting materials such as BaTiO₃, SrBi₂Ta₂O₉, (Ba,Sr)TiO₃, Pb(Zr,Ti)O₃ or Bi$_{3.25}$La$_{0.75}$Ti₃O₁₂.

Further, at step 140, a upper electrode Pt is formed by a sputtering growth.

In this embodiment, Pt metal of a single layer structure is selected as the upper electrode 101. In particular, a Pt metal layer is formed by directing current magnetron sputtering growth. The range of thickness of Pt metal is between 100 and 150 nm. However, the category of material of the upper electrode and the growing method of the upper electrode is not limited to the embodiment of the invention. For example, in other embodiments, the upper electrode 101 could also be a metal layer of Au, Ir, Ti or TaN, or a complex metal layer composed of the above metal layers. The upper electrode 101 could be also a metal oxide electrode of SrRuO₃, IrO₂, LaNiO₃.

Hereto, the Ferro-RRAM shown in FIG. 1 is substantially formed.

Figure 3:
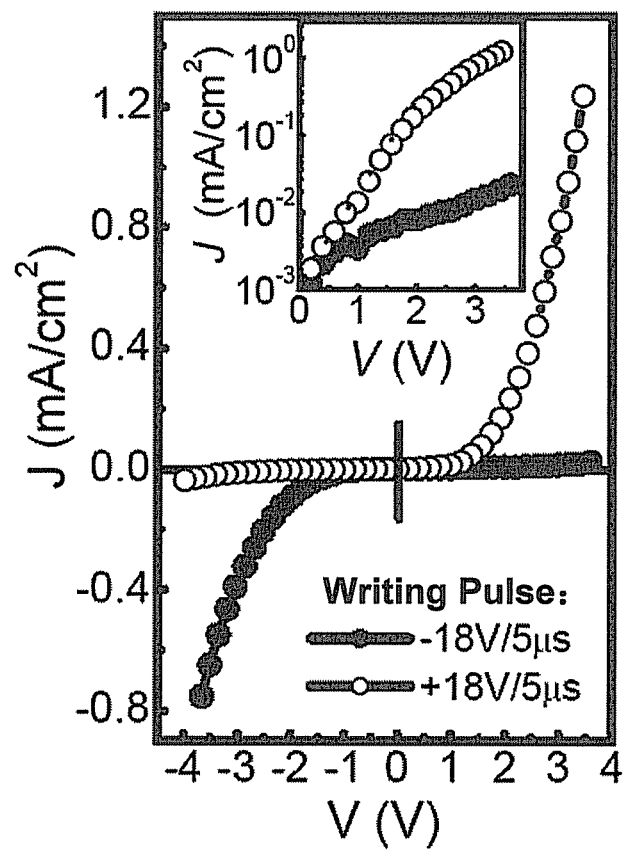
FIG. 3 is a schematic view showing the electrical characteristics of the Ferro-RRAM shown in FIG. 1.

FIG. 3 is a schematic view showing the electrical characteristics of the Ferro-RRAM shown in FIG. 1. Electrical characteristic measurements are conducted on the Ferro-RRAM fabricated by the method shown in FIG. 2. As shown in FIG. 3, in this embodiment, when a positive voltage pulse (e.g., with a pulse height of +18V and a pulse duration of 5 μs) is biased between the upper electrode 101 and the lower electrode 103, the ferroelectric semiconducting thin-film layer 102 (e.g., BiFeO₃ thin film) will be polarized in a positive direction to form forward polarized domains (forward domains). Carries in the ferroelectric semiconducting thin-film layer 102 will form a diode characteristic of being conductive in the positive direction under the effect of this ferroelectric domain orientation. On the contrary, when a negative voltage pulse (e.g., with a pulse height of −18V and a pulse duration of 5 μs) is biased between the upper electrode 101 and the lower electrode 103, the ferroelectric semiconducting thin-film layer 102 (e.g., BiFeO₃ thin film) will be polarized in a negative direction to form reversed polarized domains (reversed domains). Carries in the ferroelectric semiconducting thin-film layer 102 will form a diode characteristic of being conductive in the negative direction under the effect of this ferroelectric domain orientation. Therefore, after the positive direction polarization operation or negative direction polarization operation, when the same read voltage is biased between the upper electrode 101 and the lower electrode 103, respectively, different currents can be read. In the present invention, the current information is used as storage information. For example, when a voltage of +4 V is biased on the upper electrode 101 as a reading voltage, the current density after the positive polarization will be about 1 mA/cm², which could be defined as storage status "1" ("on", low resistance status); in the meantime, the current density after the negative polarization will be about $10^{-2}$ mA/cm², which could be defined as storage status "0" ("off", high resistance status). Therefore, at a voltage of +4 V, the resistance ratio between the two storage statuses of "0" and "1" could reach 100:1. Further, the above described positive direction polarization operation and negative direction polarization operation can be defined as writing "1" operation and writing "0" operation respectively. In this example, the writing voltages for "0" and "1" are −18V and +18V respectively. Therefore, the Ferro-RRAM 100 realizes a writing operation by changing a ferroelectric bistable polarization state via the polarity of voltage pulse signals, and readouts information by biasing a reading voltage to readout the current signal. Thus, the Ferro-RRAM 100 is a resistance-based memory and is a nonvolatile memory, of which the reading is nondestructive. Herein, the voltage pulse signal of a writing operation is larger than a coercive voltage for the ferroelectric domain switching.

It is noted that the magnitude of a reading voltage of Ferro-RRAM 100 is not limited to the above embodiments. Those skilled in the art can select the reading voltage according to such factors as current ratio between "1" and "0" statuses (on/off ratio), reading power consumption, etc. For example, the reading voltage can be selected in a range of −0.1 V-4 V. At this time, the current read after negative polarization is larger than the current read after positive polarization, and they are defined as storage statuses "1" and "0" respectively. In order to avoid an erroneous writing operation when reading data, the reading voltage is generally smaller than a coercive voltage for the ferroelectric domain switching. Moreover, in this embodiment, the writing operation voltage is in direct proportion to the thickness of the BiFeO₃ thin film. For example, the writing operation voltage decreases with the decrease of the thickness of the BiFeO$_3$ thin film, of which those skilled in the art can select specific size of the thickness of the BiFeO$_3$ thin film on basis.

Figure 4:
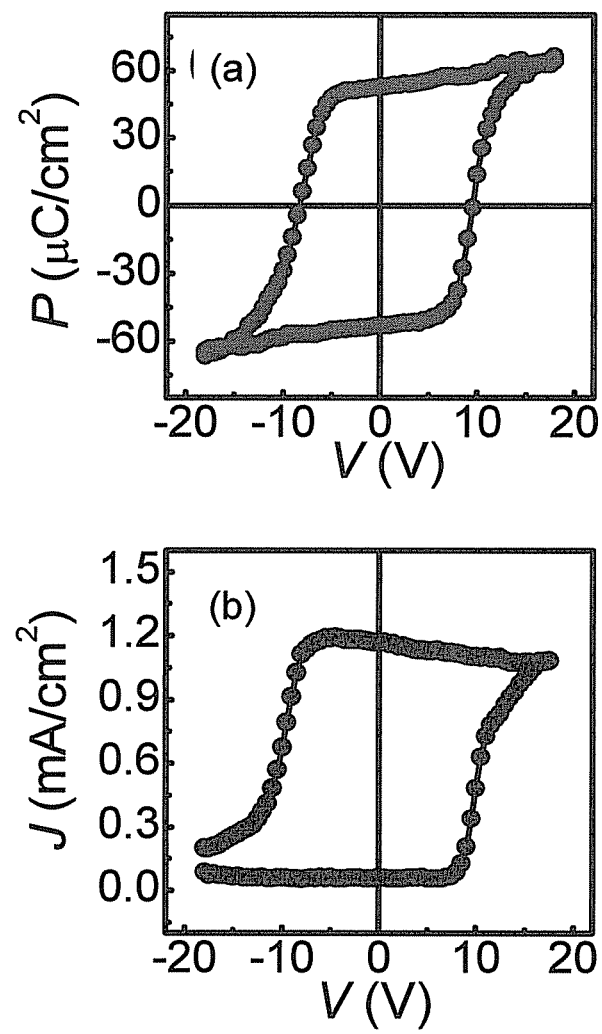
FIG. 4 is a schematic view showing a comparison between a polarization-voltage (P-V) hysteresis loop of Ferro-RRAM and a current of diode.

FIG. 4 is a schematic view showing a comparison between a polarization-voltage (P-V) hysteresis loop of Ferro-RRAM and a diode current, wherein FIG. 4(a) is a schematic view of the P-V hysteresis loop, and FIG. 4(b) is a schematic view of the current density-voltage (J-V) hysteresis loop curve. In this embodiment, the P-V hysteresis loop is substantially symmetric, and remanent polarization intensity P$_r$ at 0 V is substantially ±60 μC/cm$^2$. It can be found from a comparison between FIG. 4(a) and FIG. 4(b) that the variation of current of a ferroelectric semiconducting thin-film layer with voltage is substantially in concert with the variation of ferroelectric domain orientation with voltage, which reflects that the variation of ferroelectric domain orientations of a ferroelectric semiconducting thin-film layer can modulate the variation of current of a diode, that is, the variation of above-described conductive characteristics of the diode is caused by variation of ferroelectric domain orientations. Therefore, the storage principle of Ferro-RRAM 100 of the invention is not only totally different from the storage principle of conventional RRAM (e.g., electromigration of oxygen vacancy, or establishment or breakdown of conductive path), but also totally different from the storage principle of other Ferro-RRAMs (in which ferroelectric thin-film material is used as a dielectric layer rather than a domain-modulated ferroelectric semiconductor, it realizes current reading by tunneling effect of the dielectric layer and modulates the magnitude of reading current by variation of potential barrier). Moreover, since information reading is realized using tunneling current of ultrathin ferroelectric dielectric layer in other existing Ferro-RRAMs, the current is usually small (e.g., 3 mA/cm$^2$) and stored information is difficult to readout, while in Ferro-RRAM of the invention, the magnitude of reading current can be further improved (e.g., up to 5.4 A/cm$^2$, but on/off ratio is reduced at this moment) by reducing the thickness of BiFeO$_3$ thin film (e.g., reduced to 270 nm).

Figure 5:
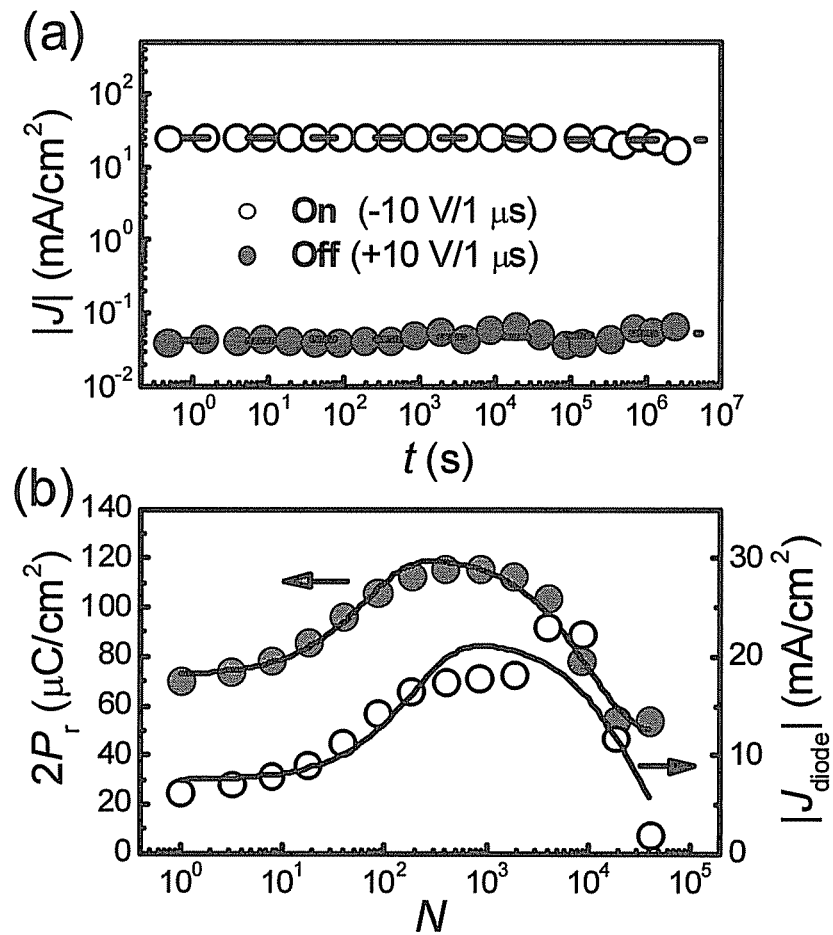
FIG. 5 is a schematic view showing a data retention characteristic of Ferro-RRAM.

FIG. 5 is a schematic view showing a data retention characteristic of the Ferro-RRAM, wherein FIG. 5(a) is a schematic view showing data retention characteristics in "on" and "off" states, and FIG. 5(b) is a schematic view showing the variation of ferroelectric remanent polarization with the number of times of writing operation and the variation of diode current (J$_{diode}$) with the number of times of writing operation. In this embodiment, the voltage signal of writing "off" is a voltage pulse of −10 V/1 μs, the voltage signal of writing "on" is a voltage pulse of +10 V/1 μs, and the reading voltage is −2.0 V. As can be seen from FIG. 5, Ferro-RRAM 100 has a good data retention characteristic, and FIG. 5(b) further reflects that variation of ferroelectric domain orientations modulates conductive characteristic of the diode as described above.

Figure 6:
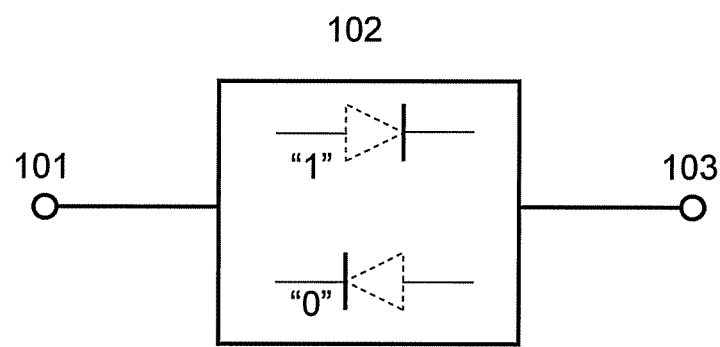
FIG. 6 is an equivalent circuit diagram of the Ferro-RRAM shown in FIG. 1.

FIG. 6 shows an equivalent circuit diagram of the Ferro-RRAM shown in FIG. 1. The ferroelectric semiconducting thin-film layer 102 with a remanent polarization can be equivalent to a diode whose conductive direction varies with polarization direction as well as with the variation of ferroelectric domain orientations. Therefore, after a negative voltage pulse is biased on the upper electrode 101, i.e., after a writing "0" operation, the ferroelectric semiconducting thin-film layer 102 is equivalent to a diode which is conductive in a negative direction; after a positive voltage pulse is biased on the upper electrode 101, i.e., after a writing "1" operation, the ferroelectric semiconducting thin-film layer 102 is equivalent to a diode which is conductive in a positive direction.

Therefore, to sum up, the Ferro-RRAM shown in FIG. 1 is the same as RRAM in that is has a sandwich-like structure and therefore has the same characteristic of being simple in structure as RRAM. Thus, the method of fabricating the Ferro-RRAM is relatively simple. One memory cell can be formed by connecting one Ferro-RRAM 100 and one selection transistor in series, and a storage array can be formed by arranging a plurality of memory cells in lines and rows.

The Ferro-RRAM 100 shown in FIG. 1 can be operated according to the following method:

in an operation of writing/"1", a writing voltage of +18 V/5 μs is biased on the upper electrode 101, a positive polarization will occur in the ferroelectric semiconducting thin-film layer 102 to generate forward ferroelectric domains and to further generate a diode conduction characteristic which is conductive in a positive direction;

in an operation of writing "0", a writing voltage of −18 V/5 μs is biased on the upper electrode 101, a negative polarization will occur in the ferroelectric semiconducting thin-film layer 102 to generate reversed ferroelectric domains and to further generate a diode conduction characteristic which is conductive in a negative direction;

in an operation of reading, a reading voltage of about 1V is biased on the upper electrode 101, the magnitudes of current flowing through the ferroelectric semiconducting thin-film layer 102 will be different in states of different diode conduction characteristics; when it is the "1" state, the ferroelectric semiconducting thin-film layer 102 is equivalent to a diode which is conductive in a positive direction, and the positive conductive current when 1V is biased is read; when it is the "0" state, the ferroelectric semiconducting thin-film layer 102 is equivalent to a diode which is conductive in a negative direction, and the negative current when 1V is biased is read; the readout current is compared with a predetermined current to differentiate its storage state.

In yet another embodiment, the ferroelectric semiconducting thin-film layer 102 can be a complex structure of the thin-film mainly composed of ferroelectric oxide and semiconductor nanocrystals. The ferroelectric oxide can be a combination of more than one or two of ferroelectric oxides including BiFeO$_3$, BaTiO$_3$, SrBi$_2$Ta$_2$O$_9$, (Ba,Sr)TiO$_3$, Pb(Zr,Ti)O$_3$ or Bi$_{3.25}$La$_{0.75}$Ti$_3$O$_{12}$, etc. Preferably, the semiconductor nanocrystal is a metal oxide semiconductor such as Fe$_2$O$_3$ formed by a corresponding excess constituent in the ferroelectric oxides (e.g., the corresponding excess constituent in BiFeO$_3$ is Fe$_2$O$_3$, while the corresponding excess constituent in BaTiO$_3$ is Barium oxide, so the Barium oxide is the semiconductor nanocrystal), making the semiconductor nanocrystal relatively easy to fabricate and form. In addition, the semiconductor nanocrystal can also be a semiconductor corresponding to elements of non ferroelectric oxide components such as ITO (Indium Tin Oxide), Zinc Oxide, etc.

In a particular example, the complex structure of the thin-film can be BiFeO$_3$/Fe$_2$O$_3$, Fe$_2$O$_3$ nanocrystal can be nano wires which are formed perpendicularly in BiFeO$_3$ nano column and connects the upper and lower electrodes. BiFeO$_3$/Fe$_2$O$_3$ complex thin-film structure is similar to the embodiment shown in FIG. 1 in different polarization statuses, wherein the resistance states of the mingled semiconductor nano wires can be converted reversibly: when writing pulse voltage is larger than a coercive voltage for the ferroelectric domain switching, the ferroelectric domains will be orientated along the direction of electric field; at this moment, a current signal can be read if a small reading voltage (smaller than the coercive voltage for ferroelectric domains) is applied along the direction of ferroelectric domains, the variation of readout current can be up to 100 times, that is, there exhibits unidirectional conduction characteristic of diode. The current rectification directions of diode can vary with the direction of writing voltage or ferroelectric domains. The magnitude of writing voltage is in direct proportion to the thickness of thin film, the magnitude of reading current can be adjusted according to the number of nano wires in unit volume. "1" and "0" are recorded by varying ferroelectric bistable polarization states; the stored logic information can be read non-destructively through use of the above diode characteristics.

It is noted that the definition of data statuses of "0" and "1" can be converted according to different applications.

The above examples mainly depict Ferro-RRAM of the invention, a method of operating the Ferro-RRAM, and a method of fabricating the Ferro-RRAM. While only some of the embodiments of the invention have been described, it is understood by those skilled in the art that the invention can be implemented in many other forms without departing from the spirit and scope thereof. Therefore, the illustrated examples and embodiments should be construed as exemplary rather than limiting. The invention may cover various modifications and replacements without departing from the spirit and scope of the invention as defined by appended claims.

The invention claimed is:

1. A Ferro-RRAM, comprising an upper electrode and a lower electrode,
    characterized by further comprising a ferroelectric semiconducting thin-film layer provided between the upper electrode and the lower electrode and serving as a storage function layer;
    wherein, the ferroelectric semiconducting thin-film layer is operable to generate a diode conduction characteristic by ferroelectric domains, and is operable to modulate a variation of current rectification direction of the diode conduction characteristic by variation of the ferroelectric domain orientations; the Ferro-RRAM stores information according to the modulated variation of current rectification direction of the diode conduction characteristic.

2. The Ferro-RRAM according to claim 1, wherein the upper electrode is a metal layer of Pt, Au, Ir, Ti or TaN, or a complex metal layer composed of the above metal layers, or a metal oxide electrode of $SrRuO_3$, $IrO_2$, $LaNiO_3$.

3. The Ferro-RRAM according to claim 1, wherein the lower electrode is a metal layer of Pt, Au, Ir, Ti or TaN, or a complex metal layer composed of the above metal layers, or a metal oxide electrode of $SrRuO_3$, $IrO_2$, $LaNiO_3$.

4. The Ferro-RRAM according to claim 1, wherein the ferroelectric semiconducting thin-film layer is $BiFeO_3$, $BaTiO_3$, $SrBi_2Ta_2O_9$, $(Ba,Sr)TiO_3$, $Pb(Zr,Ti)O_3$ or $Bi_{3.25}La_{0.75}Ti_3O_{12}$.

5. The Ferro-RRAM according to claim 1, wherein the ferroelectric semiconducting thin-film layer is a complex structure of thin-film layer mainly consisting of a ferroelectric oxide and semiconducting material nanocrystals.

6. The Ferro-RRAM according to claim 5, wherein the ferroelectric oxide is $BiFeO_3$, $BaTiO_3$, $SrBi_2Ta_2O_9$, $(Ba,Sr)TiO_3$, $Pb(Zr,Ti)O_3$ or $Bi_{3.25}La_{0.75}Ti_3O_{12}$, or a combination of the above mentioned ferroelectric oxides; the semiconductor nanocrystal is a metal oxide semiconductor formed by a corresponding excess constituent in the ferroelectric oxides, or the semiconductor nanocrystal is Indium Tin Oxide (ITO) or zinc oxide.

7. The Ferro-RRAM according to claim 1, wherein the range of thickness of the ferroelectric semiconducting thin-film layer is between 5 nm and 500 nm.

8. A method of fabricating a Ferro-RRAM, characterized in that
    the Ferro-RRAM comprises an upper electrode, a lower electrode and a ferroelectric semiconducting thin-film layer provided between the upper electrode and the lower electrode and serving as a storage function layer;
    wherein, the ferroelectric semiconducting thin-film layer is operable to generate a diode conduction characteristic by ferroelectric domains, and is operable to modulate a variation of current rectification direction of the diode conduction characteristic by variation of the ferroelectric domain orientations; the Ferro-RRAM stores information according to the modulated variation of current rectification direction of the diode conduction characteristic;
    said method comprises the following steps of:
    (1) pattern-forming the lower electrode;
    (2) pattern-forming the ferroelectric semiconducting thin-film layer on the lower electrode; and
    (3) pattern-forming the upper electrode on the ferroelectric semiconducting thin-film layer.

9. The method according to claim 8, wherein in step (2), the ferroelectric semiconducting thin-film layer is grown by pulsed laser deposition, sol-gel, molecular beam epitaxy, metal organic chemical vapor deposition, atomic layer deposition or magnetron sputtering.

10. A method of operating a Ferro-RRAM, characterized in that
    the Ferro-RRAM comprises an upper electrode, a lower electrode and a ferroelectric semiconducting thin-film layer provided between the upper electrode and the lower electrode and serving as a storage function layer;
    wherein, the ferroelectric semiconducting thin-film layer is operable to generate a diode conduction characteristic by ferroelectric domains, and is operable to modulate a variation of current rectification direction of the diode conduction characteristic by variation of the ferroelectric domain orientations; the Ferro-RRAM stores information according to the modulated variation of current rectification direction of the diode conduction characteristic;
    said method comprises the following steps of:
    in an operation of writing "0"/"1", biasing a negative pulse electrical signal between the upper electrode and the lower electrode so as to generate reversed ferroelectric domains in the ferroelectric semiconducting thin-film layer and to further generate a diode characteristic which is conductive only in a negative direction;
    in an operation of writing "1"/"0", biasing a positive pulse electrical signal between the upper electrode and the lower electrode so as to generate forward ferroelectric domains in the ferroelectric semiconducting thin-film layer and to further generate a diode conduction characteristic which is conductive only in a positive direction; and/or
    in a reading operation, biasing a reading voltage signal between the upper electrode and the lower electrode so as to read the magnitude of current flowing through the ferroelectric semiconducting thin-film layer and to thereby realize readout of the stored information.

11. The method according to claim 10, wherein the electrical signal is a voltage pulse signal.

12. The method according to claim 11, wherein the magnitude of the voltage pulse signal is larger than a coercive voltage for the ferroelectric domain switching; the magnitude of reading voltage of the reading voltage signal is smaller than the coercive voltage for the ferroelectric domain switching.

13. The method according to claim 11, wherein the magnitude of the voltage pulse signal is in direct proportion to the thickness of the ferroelectric semiconducting thin-film layer.

* * * * *